US011295976B2

(12) United States Patent
Chang et al.

(10) Patent No.: US 11,295,976 B2
(45) Date of Patent: Apr. 5, 2022

(54) SUBSTRATE SUPPORT DEVICE, SUBSTRATE CONVEYANCE ROBOT, AND ALIGNER DEVICE

(71) Applicant: KABUSHIKI KAISHA YASKAWA DENKI, Kitakyushu (JP)

(72) Inventors: Joseph Chang, Seoul (KR); Katsuhiko Shimada, Kitakyushu (JP); Nobuyuki Furukawa, Seoul (KR); Yong-Gu Kang, Seoul (KR)

(73) Assignee: KABUSHIKI KAISHA YASKAWA DENKI, Kitakyushu (JP)

( * ) Notice: Subject to any disclaimer, the term of this patent is extended or adjusted under 35 U.S.C. 154(b) by 372 days.

(21) Appl. No.: 16/689,089

(22) Filed: Nov. 20, 2019

(65) Prior Publication Data
US 2020/0176299 A1 Jun. 4, 2020

(30) Foreign Application Priority Data

Nov. 29, 2018 (JP) .............................. JP2018-223225

(51) Int. Cl.
*H01L 21/687* (2006.01)
*B65G 47/90* (2006.01)
(52) U.S. Cl.
CPC ........ *H01L 21/68707* (2013.01); *B65G 47/90* (2013.01)

(58) Field of Classification Search
None
See application file for complete search history.

(56) References Cited

U.S. PATENT DOCUMENTS 9,406,539 B2 * 8/2016 Hiroki ................. B65G 49/061
2017/0040205 A1 * 2/2017 Hiester ............ H01L 21/67742

FOREIGN PATENT DOCUMENTS

JP          2002-170862       6/2002
JP          2017208451 A  *  11/2017
KR          20170054253 A  *   5/2017   ....... H01L 21/67201

* cited by examiner

Primary Examiner — Michael S Lowe
(74) Attorney, Agent, or Firm — Mori & Ward, LLP

(57) ABSTRACT

A substrate support device includes a blade and at least one pad provided on the blade to support a substrate. The pad includes a first fixed member, a second fixed member, and a bridge. The first fixed member is provided at an outer portion of the blade. The outer portion is located outside an outer circumference portion of the substrate when the substrate is supported on the pad. The second fixed member is provided at an inner portion of the blade. The inner portion is under the substrate when the substrate is supported on the pad. The bridge is flexible and connects the first fixed member and the second fixed member to support the outer circumference portion of the substrate. An upper surface of the bridge is inclined downward from the first fixed member toward the second fixed member when the substrate is not supported on the pad.

20 Claims, 10 Drawing Sheets

SUBSTRATE SUPPORT DEVICE, SUBSTRATE CONVEYANCE ROBOT, AND ALIGNER DEVICE

CROSS-REFERENCE TO RELATED APPLICATIONS

The present application claims priority under 35 U.S.C. § 119 to Japanese Patent Application No. 2018-223225, filed Nov. 29, 2018. The contents of this application are incorporated herein by reference in their entirety.

BACKGROUND

Field of the Invention

The embodiments disclosed herein relate to a substrate support device, a substrate conveyance robot, and an aligner device.

Discussion of the Background

JP 2002-170862A discloses a horizontal multi-articular robot that serves as a substrate conveyance robot to convey a substrate such as a silicon wafer. The substrate conveyance robot also includes an "edge grip hand" that holds edge portions of the substrate between the edge grip hand.

SUMMARY

According to one aspect of the present disclosure, a substrate support device includes a blade and at least one pad which is provided on the blade to support a substrate. The at least one pad includes a first fixed member, a second fixed member, and a bridge. The first fixed member is provided at an outer portion of the blade. The outer portion is located outside an outer circumference portion of the substrate when the substrate is supported on the at least one pad. The second fixed member is provided at an inner portion of the blade. The inner portion is under the substrate when the substrate is supported on the at least one pad. The bridge is flexible and connects the first fixed member and the second fixed member to support the outer circumference portion of the substrate. An upper surface of the bridge is inclined downward from the first fixed member toward the second fixed member when the substrate is not supported on the at least one pad.

According to another aspect of the present disclosure, a substrate conveyance robot includes a hand that includes a substrate support device. The substrate support device includes a blade and at least one pad which is provided on the blade to support a substrate. The at least one pad includes a first fixed member, a second fixed member, and a bridge. The first fixed member is provided at an outer portion of the blade. The outer portion is located outside an outer circumference portion of the substrate when the substrate is supported on the at least one pad. The second fixed member is provided at an inner portion of the blade. The inner portion is under the substrate when the substrate is supported on the at least one pad. The bridge is flexible and connects the first fixed member and the second fixed member to support the outer circumference portion of the substrate. An upper surface of the bridge is inclined downward from the first fixed member toward the second fixed member when the substrate is not supported on the at least one pad.

According to the other aspect of the present disclosure, an aligner device includes a substrate support device. The substrate support device includes a blade and at least one pad which is provided on the blade to support a substrate. The at least one pad includes a first fixed member, a second fixed member, and a bridge. The first fixed member is provided at an outer portion of the blade. The outer portion is located outside an outer circumference portion of the substrate when the substrate is supported on the at least one pad. The second fixed member is provided at an inner portion of the blade. The inner portion is under the substrate when the substrate is supported on the at least one pad. The bridge is flexible and connects the first fixed member and the second fixed member to support the outer circumference portion of the substrate. An upper surface of the bridge is inclined downward from the first fixed member toward the second fixed member when the substrate is not supported on the at least one pad.

BRIEF DESCRIPTION OF THE DRAWINGS

A more complete appreciation of the present disclosure and many of the attendant advantages thereof will be readily obtained as the same becomes better understood by reference to the following detailed description when considered in connection with the accompanying drawings, wherein.

DESCRIPTION OF THE EMBODIMENTS

By referring to the accompanying drawings, a substrate support device, a substrate conveyance robot, and an aligner device according to embodiments will be described in detail below. It is noted that the following embodiments are provided for example purposes only and are not intended for limiting purposes.

As used herein, the term "orthogonal" means, in a broad sense, exactly orthogonal or approximately orthogonal within some tolerance from exactly orthogonal. As used herein, the term "parallel" means, in a broad sense, exactly parallel or approximately parallel within some tolerance from exactly parallel. As used herein, the term "horizontal" means, in a broad sense, exactly horizontal or approximately horizontal within some tolerance from exactly horizontal. As used herein, the term "level" means, in a broad sense, exactly level or approximately level within some tolerance from exactly level. As used herein, the term "vertical" means, in a broad sense, exactly vertical or approximately vertical within some tolerance from exactly vertical. Thus, these terms are used taking into consideration production-related, installation-related, processing-related, and detection-related tolerances and errors.

Figure 1:
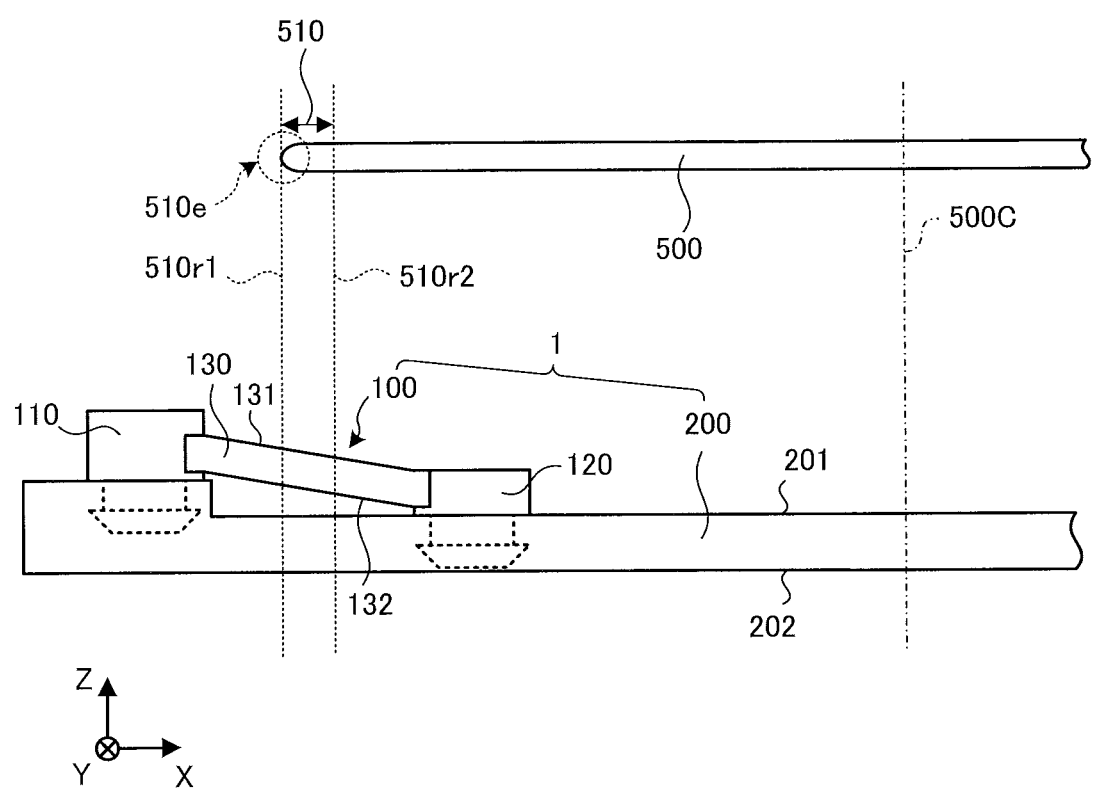
FIG. 1 is a schematic outlining a substrate support device according to an embodiment.

A substrate support device 1 according to an embodiment will be outlined by referring to FIG. 1. FIG. 1 is a schematic outlining the substrate support device 1 according to the embodiment. In this embodiment, the substrate support device 1 supports a substrate 500. The substrate 500 is a circular substrate such as a silicon wafer. In another possible example, the material of the substrate 500 may be glass such as liquid crystal glass and organic electroluminescent glass. In another possible example, the substrate 500 may have a rectangular shape.

Also in this embodiment, the substrate support device 1 is applied to a robot hand of a substrate conveyance robot. The substrate support device 1, however, is usable in a wide range of substrate support applications, such as aligner devices to adjust substrate orientations. An example substrate conveyance robot will be described later by referring to FIG. 8, and an example aligner device will be described later by referring to FIG. 10.

Referring to FIG. 1, a center line 500C passes through a center portion of the circular substrate 500. The center line 500C indicates the center of the circle of the substrate 500 without regard to a mark, such as notch and oriental flat, that may occasionally be provided on the outer circumference of the substrate 500 to indicate the substrate 500's crystal orientation. The same applies when the substrate 500 has an elliptic shape, that is, the center line 500C indicates the center of the ellipse without regard to the mark, if any.

For ease of understanding of the following description, FIG. 1 is appended with a three-dimensional orthogonal coordinate system. In the coordinate system, the vertically upward direction corresponds to the positive direction of Z axis; and the direction toward the center line 500C of the substrate 500 supported by the substrate support device 1 corresponds to the positive direction of X axis. It is to be noted that the X axis corresponds to the "radial direction" of the substrate 500, and Y axis corresponds to the "circumferential direction" of the substrate 500.

To clearly illustrate the position at which the substrate 500 is supported by the substrate support device 1, FIG. 1 illustrates a state before the substrate 500 is supported by the substrate support device 1. The substrate 500 has an edge portion 510e at the outer edge of the substrate 500. The edge portion 510e is obtained by subjecting the outer edge to bevel machining Specifically, the outer edge of the substrate 500 is ground into a round shape smoothly connecting to the upper surface and the lower surface of the substrate 500. While in this embodiment the outer edge of the substrate 500 is ground into a round shape smoothly connecting to the upper surface and the lower surface of the substrate 500, the outer edge of the substrate 500 may be ground into a round shape smoothly connecting to the lower surface of the substrate 500 alone. In another possible example, the substrate 500 may not necessarily be subjected to round machining. When round machining is omitted, the edge portion 510e is equivalent to the outer circumferential surface of the substrate 500.

In the following description, the portion of the substrate 500 subjected to bevel machining will be referred to as "edge portion 510e", and the portion of the substrate 500 including the edge portion 510e and part of the upper surface and the lower surface of the substrate 500 connecting to the edge portion 510e will be referred to as "outer circumference portion 510". Referring to FIG. 1, diameter 510r1 denotes the outermost diameter of the outer circumference portion 510, that is, the outermost diameter of the edge portion 510e, and diameter 510r2 denotes the innermost diameter of the outer circumference portion 510. That is, the outer circumference portion 510 is the portion of the substrate 500 defined between the diameter 510r1 and the diameter 510r2.

As illustrated in FIG. 1, the substrate support device 1 includes a pad 100 and a blade 200. The pad 100 is made of a flexible material such as elastomer, and is fixed to the blade 200. It is to be noted that while in FIG. 1 a single pad 100 is illustrated, the substrate support device 1 supports the substrate 500 using a plurality of pads 100. A configuration in which the substrate support device 1 includes a plurality of pads 100 will be described later by referring to FIG. 5 and other drawings.

The pad 100 will be described first. The pad 100 includes a first fixed member 110 and a second fixed member 120. The first fixed member 110 is fixed to a radially outer portion of the blade 200. The radially outer portion is located beyond the outer circumference portion 510 of the substrate 500 when the substrate 500 is supported by the pad 100. The second fixed member 120 is fixed to a radially inner portion of the blade 200. The radially inner portion is closer to the center portion of the substrate 500 than the outer circumference portion 510 of the substrate 500 is to the center portion of the substrate 500 when the substrate 500 is supported by the pad 100. As used herein, the term "center portion" of the substrate 500 refers to the portion of the substrate 500 through which the center line 500C passes. The pad 100 also includes a bridge 130. The bridge 130 connects the first fixed member 110 and the second fixed member 120 to each other, and supports the outer circumference portion 510 of the substrate 500.

As described above, the pad 100 is made of a flexible material. This makes the pad 100 elastically deformable; as illustrated in FIG. 1, the upper surface, 131, of the pad 100 is inclined downward from the first fixed member 110 toward the second fixed member 120, when the pad 100 is fixed to the blade 200. Thus, when the substrate 500 is not supported by the pad 100, the upper surface 131 is inclined downward from the first fixed member 110 toward the second fixed member 120. An example shape that the pad 100 has before the pad 100 is fixed to the blade 200 will be described later by referring to FIG. 2A and other drawings.

Thus, the pad 100 includes the bridge 130, which is flexible enough to be higher on the radially outside and lower on the radially inside. Using such pad 100 enables the substrate support device 1 to support the outer circumference portion 510 of the substrate 500 with no or minimal slippage. This minimizes damage to the substrate 500, which is the target to support, while eliminating or minimizing displacement and/or dropping of the substrate 500.

Also as illustrated in FIG. 1, the lower surface, 132, of the bridge 130 is out of contact with the upper surface 201 of the blade 200, when the substrate 500 is not supported by the pad 100. Also, when the substrate 500 is supported by the pad 100, the bridge 130, which is made of a flexible material, bends approximately to the shape of the edge portion 510e of the substrate 500 by the weight of the substrate 500.

Thus, a space is secured under the bridge 130. This increases the degree of bendability of the bridge 130. Specifically, the bridge 130 is bendable along the outer shape of the substrate 500; for example, over the area between the bevel-machined portion and the lower surface of the substrate 500. That is, the bridge 130 is able to contact the substrate 500 over a larger area. This enables the bridge 130 to support the substrate 500 while eliminating or minimizing displacement of the substrate 500.

The degree of flexibility of the bridge 130 may be adjusted in a desired manner by adjusting the proportion of the materials of elastomer, which is the material of the bridge 130, and/or by adjusting the shape of the bridge 130. This will be described later by referring to FIGS. 7A and 7B.

The blade 200 will be described. The blade 200 may be made of, for example, metal such as aluminum alloy or ceramics. In this respect, it suffices that the blade 200 is approximately horizontal at least on the upper surface. It is to be noted that the blade 200 may be planar on the surface.

The blade 200 may be an integrally formed member or an assembly of a plurality of members. Also, a single blade 200 may include a plurality of pads 100, or the substrate support device 1 may support, at the same height, blades 200 each including a single pad 100.

It is to be noted that the blade 200 is provided with holes and a depression (such as a groove) for the pad 100 to be fitted in. This will be described later by referring to FIGS. 3A and 3B. As used herein, the term "depression" refers to a portion depressed further inwardly than the surface of the blade 200. For example, when the surface of the blade 200 is a planar surface, the planar surface is regarded as a reference such that a portion depressed further inwardly than the planar surface will be referred to as "depression" or "depressed", and a portion protruding outwardly beyond the planar surface will be referred to as "protrusion" or "protruding". These portions may occasionally be referred to as "depression and protrusion". The same applies when the surface of the blade 200 is a curved surface. While in FIG. 1 the height at which the blade 200 supports the first fixed member 110 is larger than the height at which the blade 200 supports the second fixed member 120, the heights may be identical to each other. This will be described later by referring to FIGS. 9A and 9B.

Figure 2A:
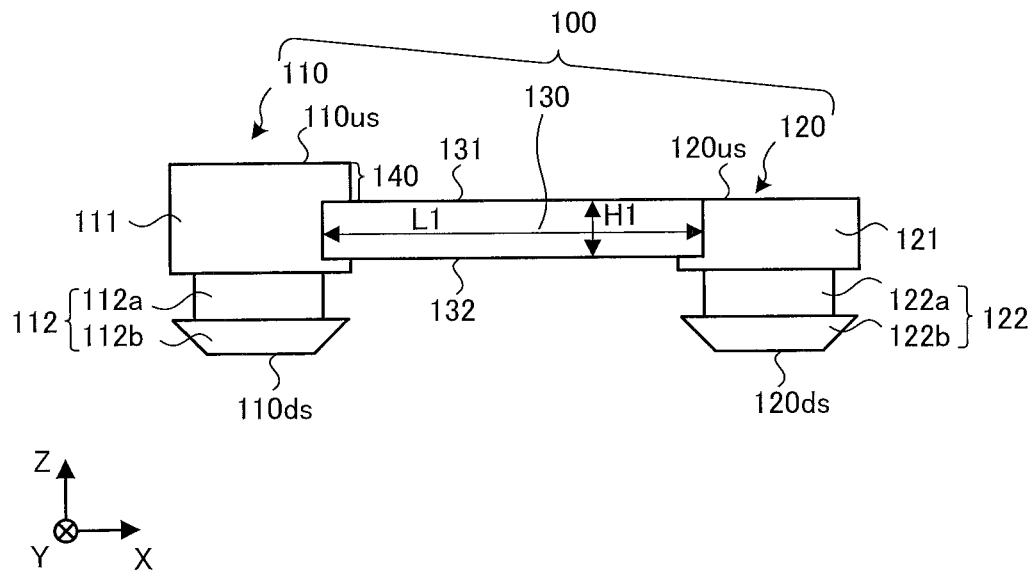
FIG. 2A is a side view of a pad.
Figure 2B:
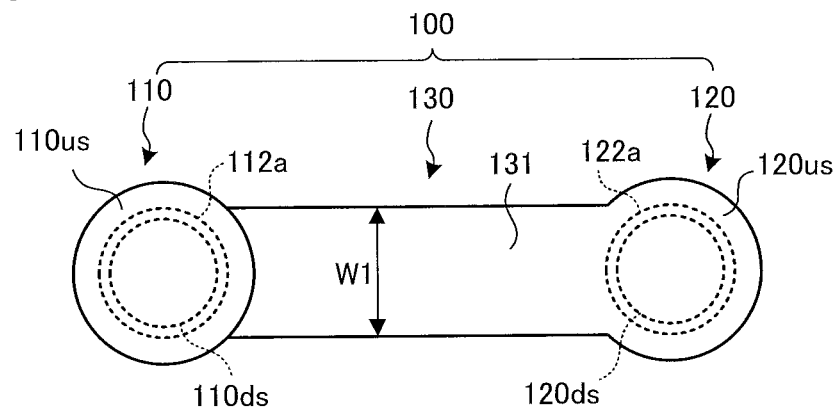
FIG. 2B is a top view of the pad.

The pad 100 illustrated in FIG. 1 will be described in more detail by referring to FIGS. 2A and 2B. FIG. 2A is a side view of the pad 100, and FIG. 2B is a top view of the pad 100. The shape of the pad 100 illustrated in FIGS. 2A and 2B is a shape that the pad 100 has before the pad 100 is fixed to the blade 200 illustrated in FIG. 1, that is, a shape of the pad 100 in un-fixed state.

As illustrated in FIG. 2A, the first fixed member 110 includes a support 111 and a hook 112. The support 111 supports, on its circumferential surface, one end side of the bridge 130. The hook 112 protrudes from the lower surface of the support 111.

The hook 112 includes a shaft 112a and an umbrella 112b. The shaft 112a has an outer diameter smaller than the outer diameter of the support 111. The umbrella 112b has an outer diameter that is larger than the outer diameter of the shaft 112a and that is equal to or less than the outer diameter of the support 111. The umbrella 112b is tapered toward the lower end of the umbrella 112b. As illustrated in FIG. 2A, the umbrella 112b has a horizontal lower surface 110ds at the lower end of the umbrella 112b. Making the lower end of the umbrella 112b horizontal decreases the height of the entirety of the first fixed member 110.

The support 111 includes a stopper 140. The stopper 140 has an upper end portion higher than the upper surface 131 of the bridge 130. The first fixed member 110 is located outside the substrate 500 (see FIG. 1) when the substrate 500 is supported by the pad 100. By providing such first fixed member 110 with the stopper 140, removal of the substrate 500 is prevented. It is to be noted that the upper end portion of the stopper 140 may be higher than the upper surface of the substrate 500 (see FIG. 1) when the substrate 500 is supported by the bridge 130. This prevents removal of the substrate 500 more reliably.

In the example illustrated in FIG. 2A, the upper end portion of the stopper 140 is a horizontal upper surface 110us. This decreases the height of the entirety of the first fixed member 110. Another possible example is that the upper end portion of the stopper 140 protrudes upward or depressed downward.

Also as illustrated in FIG. 2A, the support 111 supports the one end side of the bridge 130 at a position higher than the lower surface of the support 111. Since the lower surface of the support 111 is fixed to the blade 200 (see FIG. 1), the space defined under the bridge 130 is secured more reliably.

The second fixed member 120 has an approximately cylindrical shape, similarly to the first fixed member 110, and includes a support 121 and a hook 122. The support 121 supports, on its circumferential surface, the other end side of the bridge 130. The hook 122 protrudes from the lower surface of the support 121. It is to be noted that the shape of the hook 122 is approximately identical to the shape of the first fixed member 110 and will not be elaborated upon here.

The support 121 has a horizontal upper surface 120us at an upper end portion of the support 121, and is approximately flush with the upper surface 131 of the bridge 130. That is, the second fixed member 120, which is closer to the center portion of the substrate 500 than the substrate 500 is to its center portion, has no stopper, as opposed to the first fixed member 110. This ensures that when the bridge 130 bends by the weight of the substrate 500, the substrate 500 can be placed on the upper surface 120us of the second fixed member 120. That is, by aligning the upper surfaces 120us of the plurality of pads 100 on the same horizontal plane, the substrate 500 is kept level. It is to be noted that the upper end portion of the second fixed member 120 may be lower or higher than the upper surface 131 of the bridge 130.

Also as illustrated in FIG. 2A, the support 121 supports the other end side of the bridge 130 at a position higher than the lower surface of the support 121. Since the lower surface of the support 121 is fixed to the blade 200, the space defined under the bridge 130 is secured more reliably.

In the state in which the pad 100 illustrated in FIG. 2A is fixed to the blade 200 illustrated in FIG. 1, the first fixed member 110 is higher than the second fixed member 120. In other words, the upper surface 131 of the bridge 130 is inclined downward from the first fixed member 110 toward the second fixed member 120. The bridge 130 has a length of "L1", and the bridge 130 has a thickness of "H1".

As illustrated in FIG. 2B, the first fixed member 110 and the second fixed member 120 each have an approximately circular shape in plan view. That is, the first fixed member 110 and the second fixed member 120 each have an approximately cylindrical shape. Also, the upper surface 131 of the bridge 130 is approximately flush with the upper surface 120us of the second fixed member 120. In contrast, the upper surface 110us of the first fixed member 110 is higher than the upper surface 131 of the bridge 130. The bridge 130 has a width of "W1".

As illustrated in FIGS. 2A and 2B, the bridge 130 has a length of "L1", a thickness of "H1", and a width of "W1". By making the thickness "H1" smaller relative to the length and the width, the bridge 130 becomes more easily bendable.

Also, by making the length "L1" larger relative to the width and the thickness, the bridge 130 becomes more easily bendable. Thus, by adjusting the length, the thickness, and the width of the bridge 130 in a desired manner, the bendability of the bridge 130 can be adjusted. Thus, by adjusting the dimension(s) of the bridge 130, a desired amount of bending is obtained, depending on the size (weight) of the substrate 500 (see FIG. 1).

Figure 3A:
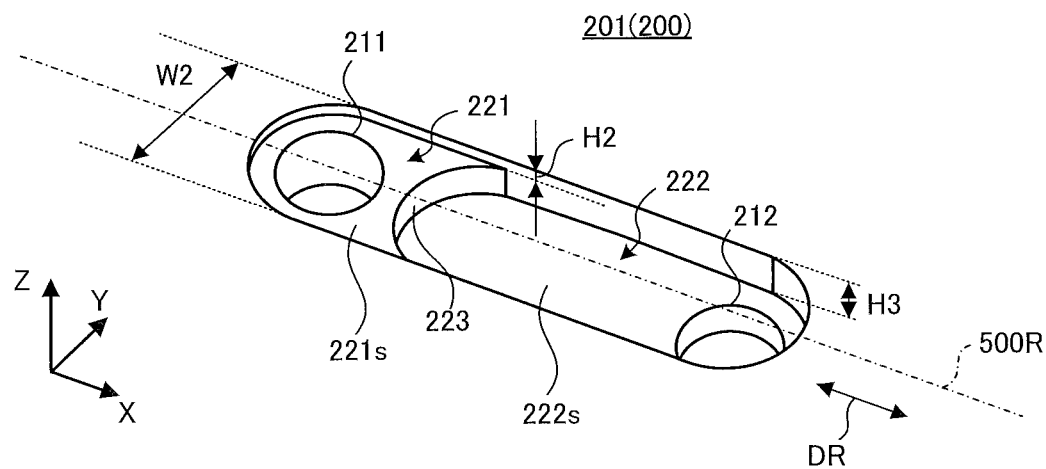
FIG. 3A is a perspective view of depressions on a blade.
Figure 3B:
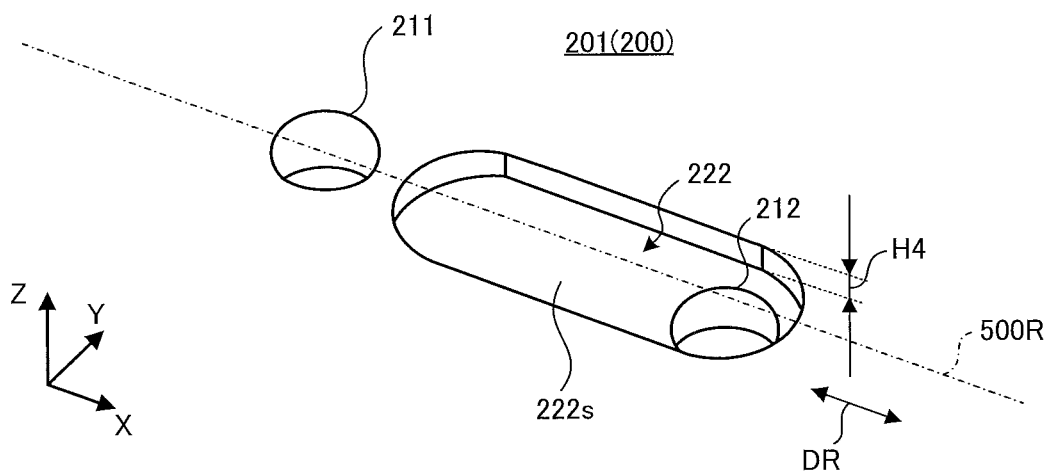
FIG. 3B is a perspective view of a modified depression on the blade.

By referring to FIGS. 3A and 3B, description will be made with regard to depression shapes disposed on the blade 200 illustrated in FIG. 1. FIG. 3A is a perspective view of depressions on the blade 200, and FIG. 3B is a perspective view of a modified depression on the blade 200. Referring to FIGS. 3A and 3B, a line 500R is a radiation line passing through the center line 500C of the substrate 500 (see FIG. 1), and radial direction DR is a direction along the line 500R.

As illustrated in FIG. 3A, a first hole 211 and a second hole 212 are disposed on the upper surface 201 of the blade 200. The first hole 211 is a through hole for the first fixed member 110 of the pad 100 (see FIG. 1) to be fitted in. The second hole 212 is a through hole for the second fixed member 120 of the pad 100 to be fitted in. The first hole 211 and the second hole 212 are aligned in the radial direction DR. This simple configuration, in which the blade 200 is provided with through holes, makes the pad 100 attachable and detachable to and from the blade 200.

Also as illustrated in FIG. 3A, the second hole 212 is disposed in a second depression 222. The second depression 222 has a bottom surface 222s, which is lower than the upper surface 201 of the blade 200. The second depression 222 extends toward the first hole 211. In other words, the second depression 222 extends in the radial direction DR. Also, the second depression 222 has a width (W2) larger than the width (W1) of the bridge 130 of the pad 100. That is, the second depression 222 is wider than the bridge 130.

The first hole 211 is disposed in a first depression 221. The first depression 221 has a bottom surface 221s, which is lower than the upper surface 201 of the blade 200 and higher than the bottom surface 222s of the second depression 222. Thus, the blade 200 has two depth levels of depression. This decreases the height of the entirety of the substrate support device 1 (see FIG. 1) while ensuring that the posture of the bridge 130 is higher on the radially outside and lower on the radially inside. It is to be noted that as illustrated in FIG. 3A, the width of the first depression 221 may be identical to the width (W2) of the second depression 222.

The bottom surface 221s of the first depression 221 is lower than the upper surface 201 of the blade 200 by "H2". Also, the bottom surface 222s of the second depression 222 is lower than the upper surface 201 of the blade 200 by "H3". That is, the bottom surface 222s is lower than the bottom surface 221s by "H3−H2" (provided that H3>H2).

As illustrated in FIG. 3A, a wall surface 223 corresponds to the difference in level between the bottom surface 221s and the bottom surface 222s. The wall surface 223 is curved toward the first hole 211. Making the wall surface 223 curved in this manner makes interference with the bridge 130 difficult to occur, with the result that the bending of the bridge 130 is less likely to be hindered.

By referring to FIG. 3B, a depression modification of FIG. 3A will be described. The depression illustrated in FIG. 3B is equivalent to the second depression 222, with the first depression 221 in FIG. 3A omitted. As illustrated in FIG. 3B, the first hole 211 is different from the first hole 211 illustrated in FIG. 3A in that the first hole 211 is disposed on the upper surface 201 of the blade 200. The second hole 212 is disposed in the second depression 222, similarly to the second hole 212 illustrated in FIG. 3A.

As illustrated in FIG. 3B, the bottom surface 222s of the second depression 222 is lower than the upper surface 201 of the blade 200 by "H4". In order to realize the inclination of the bridge 130 realized by the configuration illustrated in FIG. 3A, the relationship "H4=H3−H2" may be satisfied.

Figure 4:
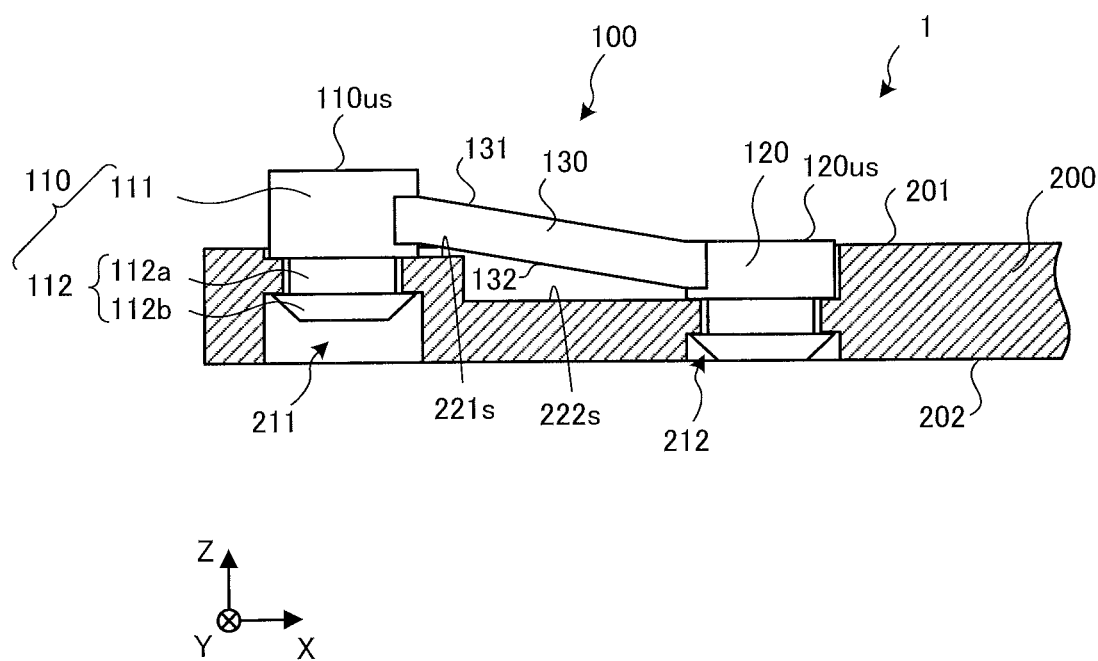
FIG. 4 is a cross-sectional view of the blade with the pad fixed to the blade.

By referring to FIG. 4, description will be made with regard to the substrate support device 1 in which the pad 100 illustrated in FIGS. 2A and 2B is fixed in the depressions on the blade 200 illustrated in FIG. 3A. FIG. 4 is a cross-sectional view of the blade 200 with the pad 100 fixed to the blade 200. It is to be noted that the cross-section of FIG. 4 is obtained by cutting the blade 200 along a plane including the Z axis and the line 500R illustrated in FIG. 3A. It is also to be noted that in the cross-section of FIG. 4, the pad 100 is left uncut.

As illustrated in FIG. 4, the bottom of the support 111 of the first fixed member 110 is in contact with the bottom surface 221s. The hook 112 has been inserted into the first hole 211 in the direction from the upper surface 201 of the blade 200 and brought into engagement with a lower surface 202 of the blade 200.

The diameter of the first hole 211 is smaller than the outer diameter of the support 111, larger than the outer diameter of the shaft 112a, and smaller than the outer diameter of the umbrella 112b. Also, the first hole 211 has a depth (height) in which the hook 112 is containable.

Thus, the hook 112 of the first fixed member 110 is fitted in the first hole 211. This ensures that the first fixed member 110 is fixed to the blade 200. Similarly, the second fixed member 120 is fitted in the second hole 212. This ensures that the second fixed member 120 is fixed to the blade 200. It is to be noted that the second hole 212 has a depth (height) in which a lower end portion of the second fixed member 120 is containable.

As illustrated in FIG. 4, the second fixed member 120 is fixed to the bottom surface 222s, which is lower than the bottom surface 221s. This makes the upper surface 131 of the bridge 130 inclined downward from the first fixed member 110 toward the second fixed member 120.

Also as illustrated in FIG. 4, at least part of the pad 100 is contained in the depressions on the upper surface 201 of the blade 200. This makes the height of the entirety of the substrate support device 1 lower than when no depressions are provided on the upper surface 201. Also, lower end portions of the pad 100 are prevented from protruding beyond the lower surface 202 of the blade 200. This makes the lower surface 202 of the blade 200 flat.

It is to be noted that as illustrated in FIG. 4, the upper surface 120us of the second fixed member 120 is preferably higher than the upper surface 201 of the blade 200. This is for the purpose of keeping the substrate 500 out of contact with the blade 200, even if the bridge 130 bends due to the weight of the substrate 500 (see FIG. 1). It is to be noted that considering that the substrate 500 itself has some bending or curving, it is preferable that the amount by which the upper surface 120us of the second fixed member 120 protrudes beyond the upper surface 201 of the blade 200 is such that the substrate 500 is kept out of contact with the blade 200.

Figure 5:
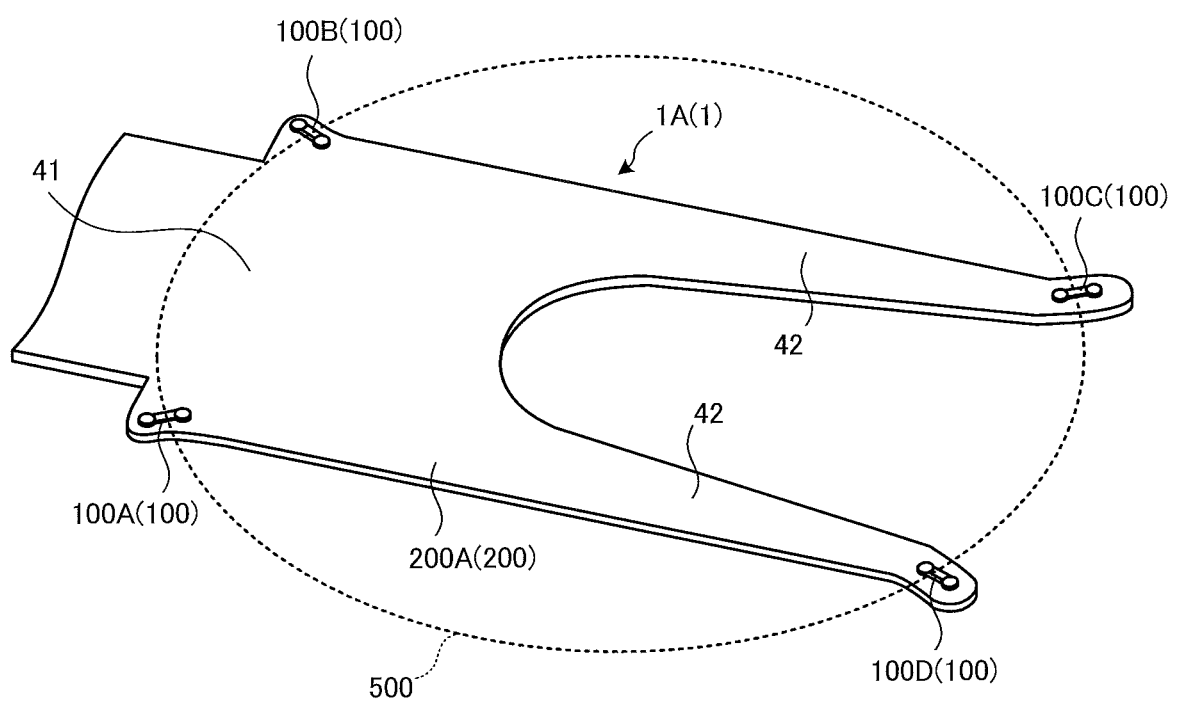
FIG. 5 is a perspective view of a robot hand to which the substrate support device is applied.

By referring to FIG. 5, description will be made with regard to an example in which the substrate support device 1 illustrated in FIG. 1 and other drawings is applied to a robot hand. FIG. 5 is a perspective view of a robot hand to which the substrate support device 1 is applied. Specifically, FIG. 5 is a view from a diagonally upward direction of a member of a robot hand for supporting the substrate 500.

As illustrated in FIG. 5, a substrate support device 1A includes a blade 200A. The blade 200A has a shape obtained by adjusting the shape of the blade 200 into a shape suitable for the robot hand. The blade 200A includes a base end portion 41 and a fork 42. The fork 42 has a two-forked shape branching from the base end portion 41. The blade 200A is obtained by, for example, machining a metal material or a ceramics material into the shape illustrated in FIG. 5. The blade 200A is provided with the above-described through holes and depression(s).

Four pads 100 are fixed to the blade 200A. Specifically, a pad 100C is fixed to one leading end portion of the fork 42; a pad 100D is fixed to another leading end portion of the fork 42; a pad 100A is fixed to one position on the base end portion 41; and a pad 100B is fixed to another position on the base end portion 41. These leading end portions and positions are where the outer circumference portion 510 (see FIG. 1) of the substrate 500 is supported. Each of the pads 100 is pointed in the radial direction of the substrate 500 and fixed to the blade 200A with the bridge 130 (see FIG. 1) having such an inclined posture that the bridge 130 is higher on the outside in the radial direction and lower on the inside in the radial direction.

While in FIG. 5 four pads 100 (pad 100A, pad 100B, pad 100C, and pad 100D) are provided, any other number of pads 100 more than two may be provided. By providing more than two pads 100, the substrate 500 is prevented from being displaced, no matter which direction along a horizontal plane the substrate support device 1A is moved in.

Figure 6:
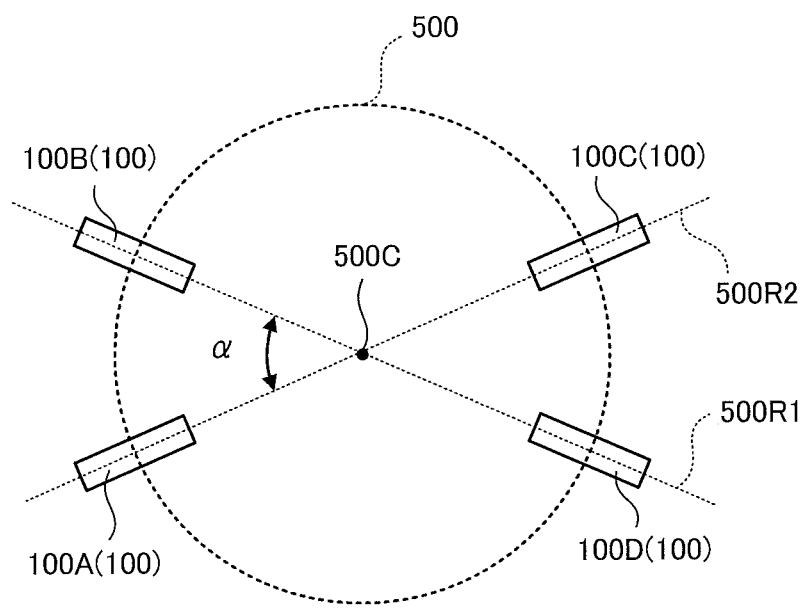
FIG. 6 illustrates an example arrangement of a plurality of pads.

The arrangement of the pads 100 illustrated in FIG. 5 will be described in more detail below by referring to FIG. 6. FIG. 6 illustrates an example arrangement of the plurality of pads 100. It is to be noted that in FIG. 6, the bridge 130 (see FIG. 1) of each pad 100 is illustrated in a simplified, rectangular form having a longitudinal length in the radial direction.

As illustrated in FIG. 6, the pad 100B and the pad 100D are aligned along a line 500R1, which passes through the center line 500C of the substrate 500. The pad 100A and the pad 100C are aligned along a line 500R2, which passes through the center line 500C of the substrate 500. The angle defined between the pad 100B and the pad 100A is "α". Similarly, the angle defined between the pad 100C and the pad 100D is "α".

It is to be noted that the defined angle "α" is adjustable in a desired manner based on the width of the robot hand illustrated in FIG. 5 (width in the direction in which the forked ends of the fork 42 face each other). In the example illustrated in FIG. 6, the defined angle "α" is smaller than 90 degrees. When the width of the robot hand is larger than the width illustrated, it is possible to increase the defined angle "α" to a maximum of 90 degrees. When the defined angle "α" is 90 degrees, the four pads 100 are arranged at equal intervals in the circumferential direction of the substrate 500.

The above description referring to FIGS. 5 and 6 is under the assumption that there are four pads 100 provided. In another possible example in which there are three pads 100 provided, the defined angle "α" may be 120 degrees, in which case the three pads 100 are arranged at equal intervals in the circumferential direction of the substrate 500. It is to be noted that the arrangement of the pads 100 illustrated in FIGS. 5 and 6 has been provided for exemplary purposes only; the defined angle between adjacent pads 100 may be adjusted in a desired manner.

In a possible example in which the substrate 500 has a rectangular shape, four pads 100 may be arranged at positions corresponding to the four corners or on the four sides of the rectangle, and pointed in directions along lines passing through the center line 500C. It is also possible to arrange a total of three pads 100 at positions corresponding to two adjacent corners of the rectangle of the substrate 500 and the side of the rectangle facing the side between the two corners.

Figure 7A:
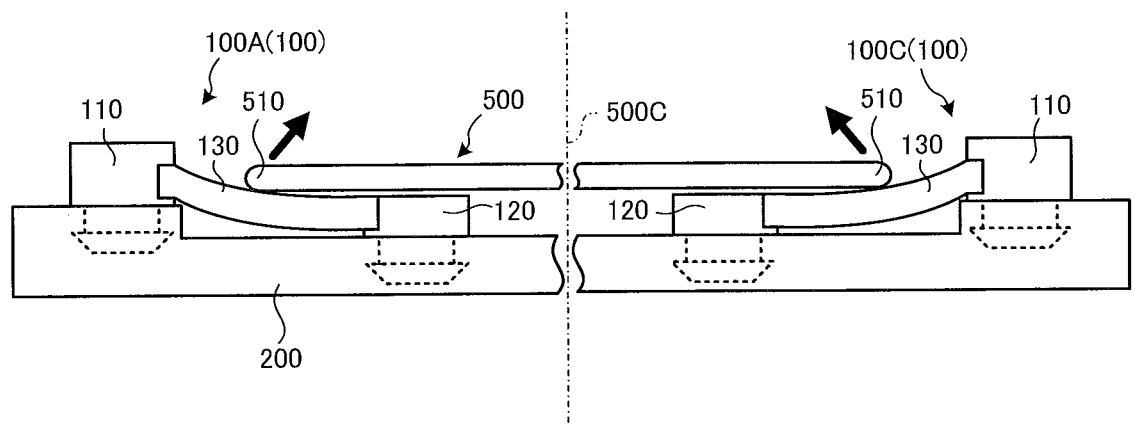
FIG. 7A is a first illustration of flexibility of a bridge.

By referring to FIGS. 7A and 7B, flexibility of the bridge 130 of the pad 100 will be described. FIG. 7A is a first illustration of flexibility of the bridge 130, and FIG. 7B is a second illustration of flexibility of the bridge 130.

Figure 7B:
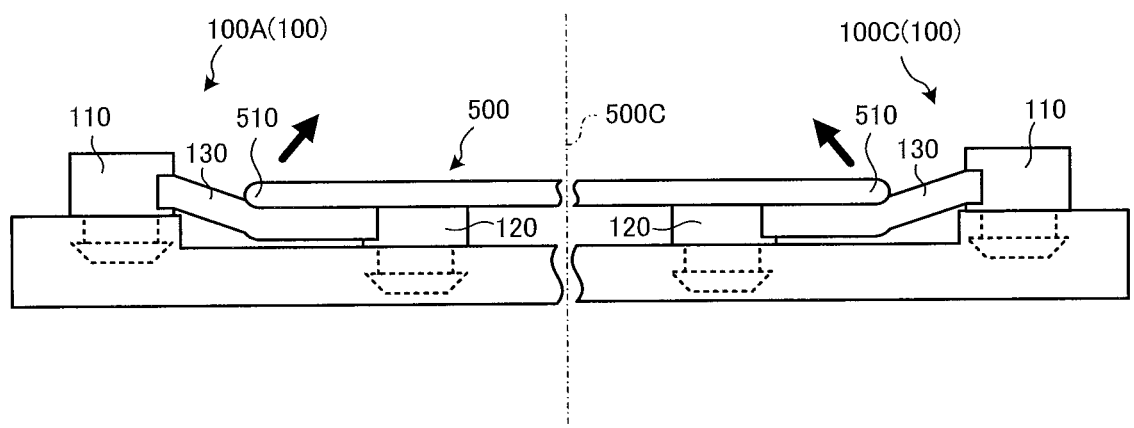
FIG. 7B is a second illustration of flexibility of the bridge.

It is to be noted that the degree of bendability of the bridge 130 illustrated in FIG. 7A is lower than the degree of bendability of the bridge 130 illustrated in FIG. 7B. FIGS. 7A and 7B illustrate the pad 100A and the pad 100C illustrated in FIG. 6 as example pads 100 facing each other.

The flexibility of the bridge 130 of the pad 100 illustrated in FIG. 7A is adjusted such that the bridge 130 only supports the outer circumference portion 510 of the substrate 500, with the substrate 500 out of contact with the upper end portion of the second fixed member 120. As described above, the flexibility of the bridge 130 may be adjusted by adjusting the material of the pad 100 in a desired manner and/or adjusting the shape of the bridge 130 in a desired manner.

The bridge 130 of the pad 100 is higher on the first fixed member 110 side and lower on the second fixed member 120 side, even when the substrate 500 is not supported by the pad 100. When the substrate 500 is supported by the pad 100, the extension direction in which the bridge 130 extends bends to the outer shape of the outer circumference portion 510 of the substrate 500, as illustrated in FIG. 7A. That is, not only the upper surface of the bridge 130 is depressed, but also the extension direction of the bridge 130 itself is deformed, making the upper surface and lower surface of the bridge 130 deformed.

More specifically, the bridge 130 does not come into point contact with the outer circumference portion 510 of the substrate 500, but comes into surface contact with the outer shape of the outer circumference portion 510. Additionally, the bridge 130 has such a posture that an outer portion of the bridge 130 disposed radially further outward than the outer edge of the substrate 500 is higher than an inner portion of the bridge 130 disposed radially further inward than the outer edge of the substrate 500. This causes support forces to act in directions diagonally upward from the outer circumference of the substrate 500 toward the center line 500C (the support forces are indicated by the two arrows pointed diagonally upward in FIG. 7A). Thus, by deforming (bending) the extension direction of the bridge 130, the outer circumference portion 510 of the substrate 500 is supported such that the outer circumference portion 510 is surrounded by the bridge 130.

The degree of bendability of the bridge 130 of the pad 100 illustrated in FIG. 7B is higher than the degree of bendability of the bridge 130 of the pad 100 illustrated in FIG. 7A. That is, the degree of deformation (bendability) in the extension direction of the bridge 130 illustrated in FIG. 7B is higher than the degree of deformation in the extension direction of the bridge 130 illustrated in FIG. 7A.

As illustrated in FIG. 7B, the bridge 130 bends not only to the outer shape of the outer circumference portion 510 of the substrate 500 but also to the outer shape of the lower surface of the substrate 500. Since the upper surface of the bridge 130 is approximately flush with the upper surface of the second fixed member 120, the bridge 130 bends until the substrate 500 is placed on the second fixed member 120.

Thus, the degree of bendability of the bridge 130 is adjusted such that the substrate 500 is placed on the second fixed member 120 by the weight of the substrate 500. This keeps the substrate 500 supported at a high degree of levelness. This is because the upper surfaces of the second fixed members 120 of the plurality of pads 100 fixed to the blade 200 are at the same height.

Figure 8:
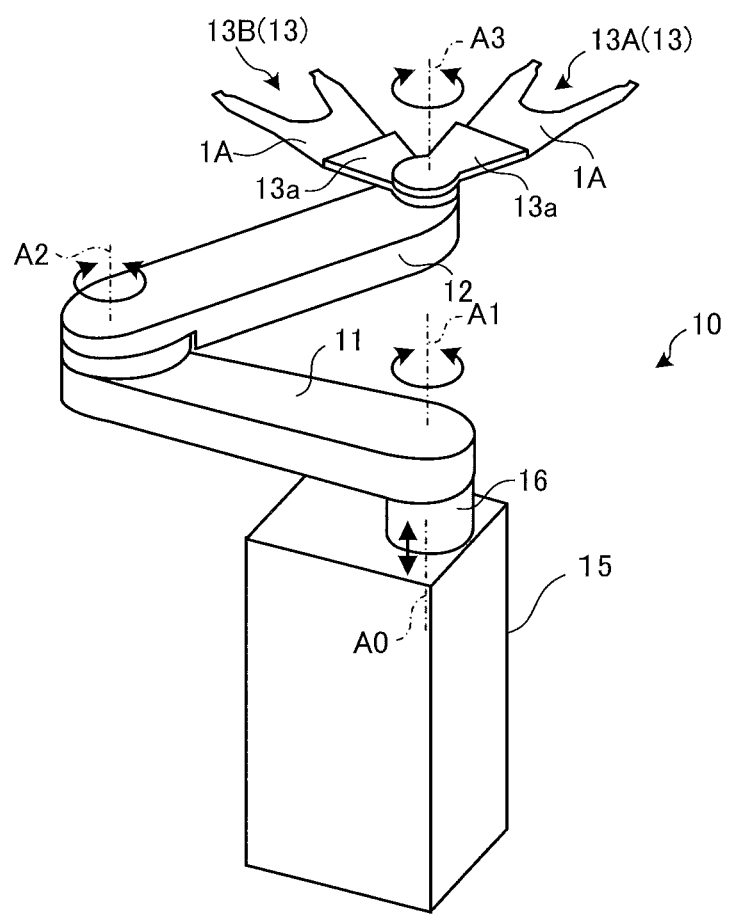
FIG. 8 is a perspective view of a substrate conveyance robot.

By referring to FIG. 8, a substrate conveyance robot 10 will be described. The substrate conveyance robot 10 includes a robot hand 13. To the robot hand 13, the substrate support device 1A illustrated in FIG. 5 is applied. FIG. 8 is a perspective view of the substrate conveyance robot 10.

The substrate conveyance robot 10 is used in a reduced pressure atmosphere (such as a vacuum chamber) in a semiconductor production environment. Examples of the substrate conveyance robot 10 include, but are not limited to: a vacuum robot to convey a substrate 500 (see FIG. 1) such as a silicon wafer; and a conveyance robot to convey rectangular glass such as liquid crystal glass and organic electroluminescent glass substrate. In the following description, the substrate conveyance robot 10 will be simply referred to as "robot 10", and the robot hand 13 will be simply referred to as "hand 13".

As illustrated in FIG. 8, the robot 10 includes a body 15, a lift 16, a first arm 11, a second arm 12, and the hand 13. As illustrated in FIG. 3, the hand 13 includes a hand 13A and a hand 13B, which are turnable coaxially. In another possible example, either the hand 13A or the hand 13B may be provided.

The body 15 is equipped with a lift mechanism (not illustrated) to lift the lift 16 upward and downward. The lift mechanism includes, for example, a ball screw extending in the vertical direction, a slider slidable on the ball screw, and an actuator to rotate the ball screw.

The lift 16 supports a base end portion of the first arm 11 turnably about first axis A1 and is movable upward and downward along vertical movement axis A0. It is to be noted that the lift 16 itself may be turnable about the first axis A1.

The first arm 11, at its leading end portion, supports a base end portion of the second arm 12 turnably about second axis A2. The second arm 12, at its leading end portion, supports a base end portion of each hand 13 turnably about third axis A3.

Each hand 13 includes a base 13a and the substrate support device 1A (see FIG. 5). The substrate support device 1A is fixed to the base 13a. The base 13a, at its base end portion, is supported by the second arm 12 turnably about the third axis A3. The substrate support device 1A is disposed at a leading end portion of the base 13a, and has a two-forked leading end portion, as described above by referring to FIG. 5. On the upper surface of the substrate support device 1A, the pads 100 are disposed to eliminate or minimize slippage and/or removal of the substrate 500.

Thus, the robot 10 is a horizontal multi-articular robot including the first arm 11, the second arm 12, and the hand 13. Also, the lift mechanism of the robot 10 enables the robot 10 to access multiple levels of substrates 500 contained in a "cassette". Also, the two hands 13 of the robot 10 enable the robot 10 to simultaneously access vertically upper and lower substrates 500 when the two hands 13 overlap each other in top view.

Also, since the substrate support device 1A is made as small as possible in height (thickness), as described above, the substrate support device 1A can be inserted between multiple levels of substrate 500 contained in a cassette without contacting any of the substrates 500. That is, the height of the entirety of the substrate support device 1A is smaller than the gaps between multiple levels of substrates 500 contained in a cassette. It is to be noted that the robot 10 will not be limited to the horizontal multi-articular robot illustrated in FIG. 8. Another possible example is that the hands 13 of the robot 10 are linearly slidable. That is, the robot 10 may have any form insofar as the robot 10 is capable of supporting (holding) a substrate 500 and conveying the substrate 500 from a first position to a second position.

Figure 9A:
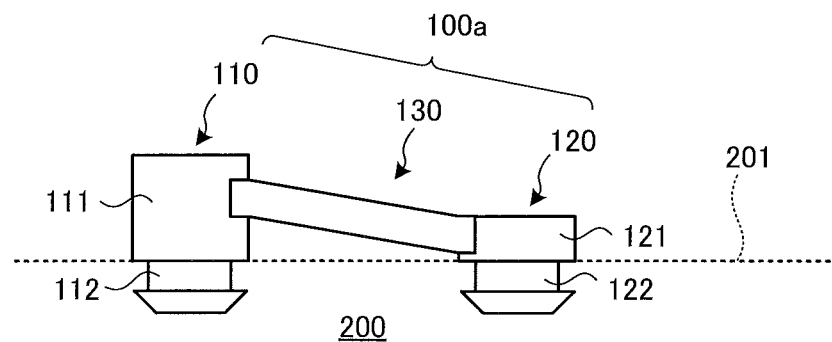
FIG. 9A is a side view of a first modification of the pad.
Figure 9A:
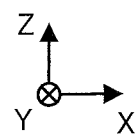
Figure 9B:
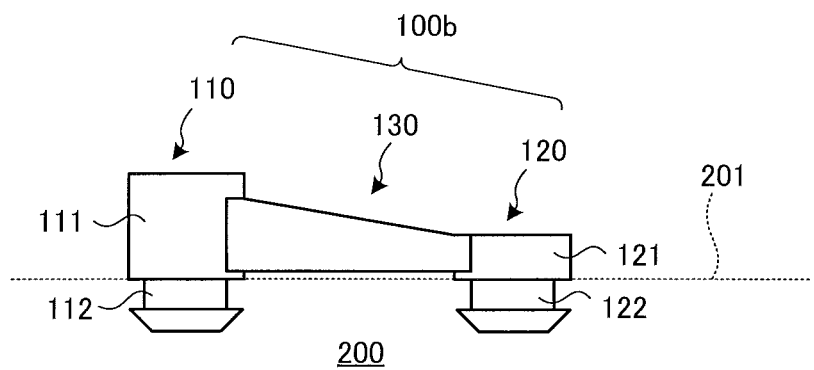
FIG. 9B is a side view of a second modification of the pad.
Figure 9B:
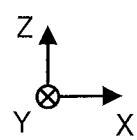

By referring to FIGS. 9A and 9B, a modification of the pad 100 illustrated in FIG. 2A will be described. FIG. 9A is a side view of a first modification of the pad 100, and FIG. 9B is a side view of a second modification of the pad 100. It is to be noted that FIGS. 9A and 9B are views from the same direction as the direction from which the pad 100 in FIG. 2A is viewed.

It is to be noted that in FIGS. 9A and 9B, the upper surface 201 of the blade 200 to which the pad 100 is fixed is a flat surface (without levels). That is, there is no high-low difference between the height of the fixed first fixed member 110 and the height of the fixed second fixed member 120. Even though there is no high-low difference, the pad 100 itself has such a shape that the upper surface of the bridge 130 is inclined downward from the first fixed member 110 toward the second fixed member 120. The following description is mainly regarding those respects in which the pads 100 illustrated in FIGS. 9A and 9B are different from the pad 100 illustrated in FIG. 2A, and those respects that the pads 100 illustrated in FIGS. 9A and 9B and the pad 100 illustrated in FIG. 2A have in common will not be described or will be least elaborated upon.

A pad 100a according to the modification illustrated in FIG. 9A is different from the pad 100 illustrated in FIG. 2A in that the height at which the first fixed member 110 supports the bridge 130 is larger than the height at which the second fixed member 120 supports the bridge 130.

Specifically, the lower surface of the support 111 of the first fixed member 110 and the lower surface of the support 121 of the second fixed member 120 are fixed to the flat upper surface 201 of the blade 200. The support 111 of the first fixed member 110 supports the bridge 130 at a position higher than the position at which the support 121 of the second fixed member 120 supports the bridge 130. This makes the upper surface of the bridge 130 inclined with the first fixed member 110 at a higher position and the second fixed member 120 at a lower position.

A pad 100b according to the modification illustrated in FIG. 9B is different from the pad 100 illustrated in FIG. 2A in that the bridge 130 is tapered. In FIG. 9B, the lower surface of the bridge 130 is out of contact with the upper surface 201 of the blade 200. Another possible example is that the lower surface of the bridge 130 is at the same height as the height of the upper surface 201. That is, the lower surface of the support 111 of the first fixed member 110, the lower surface of the bridge 130, and the lower surface of the support 121 of the second fixed member 120 may be on the same horizontal plane.

As illustrated in FIG. 9B, the upper surface of the bridge 130 is inclined downward from the first fixed member 110 toward the second fixed member 120, and the lower surface of the bridge 130 is parallel to the upper surface 201 of the blade 200. Specifically, the bridge 130 has such a tapered shape that the thickness of the bridge 130 gradually decreases from the first fixed member 110 toward the second fixed member 120. With this modification as well, the upper surface of the bridge 130 is inclined with the first fixed member 110 at a higher position and the second fixed member 120 at a lower position.

While in FIG. 9B the upper surface of the bridge 130 is inclined linearly, the upper surface of the bridge 130 may be inclined curvilinearly. For example, the upper surface of the bridge 130 may be curved downward as the bridge 130 is inclined downward from the first fixed member 110 toward the second fixed member 120.

Figure 10:
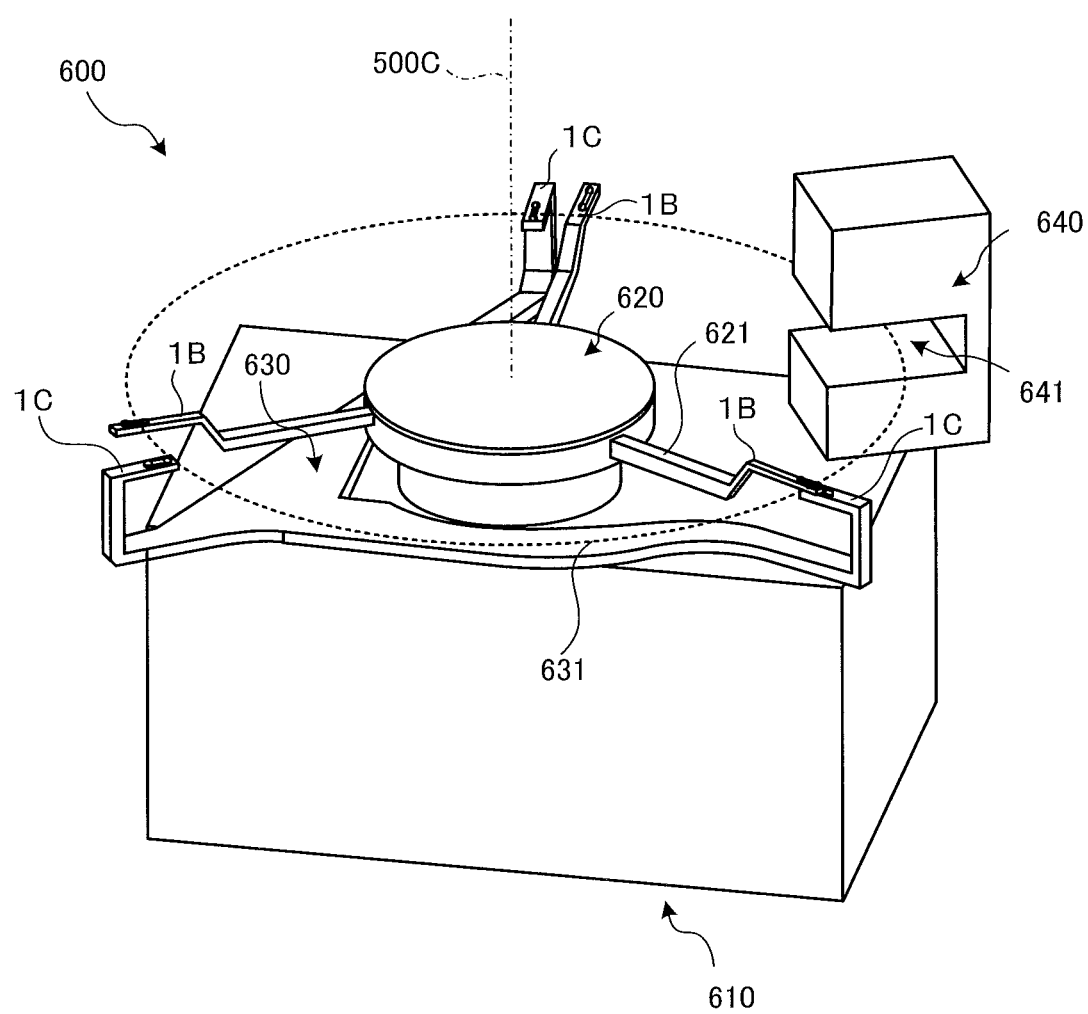
FIG. 10 is a perspective view of an aligner device.

By referring to FIG. 10, an aligner device 600 will be described. To the aligner device 600, the substrate support device 1 is applied. FIG. 10 is a perspective view the aligner device 600. In FIG. 10, a substrate support device 1B and a substrate support device 1C are illustrated. The substrate support device 1B supports the substrate 500 horizontally. Thus, the aligner device 600 includes two substrate support devices 1.

As illustrated in FIG. 10, the aligner device 600 includes a body 610, a rotatable support 620, a lift support 630, and a sensor 640. The body 610 supports, on its upper surface, the rotatable support 620, the lift support 630, and the sensor 640. Also, the body 610 contains: a driving source for rotating the rotatable support 620 (a non-limiting example of this driving source is a servo motor); and a driving source for lifting the lift support 630 upward and downward (a non-limiting example of this driving source is an air pump).

The rotatable support 620 is rotatable about the center line 500C. The rotatable support 620 also includes support arms 621. The support arms 621 extend radially outward from the center line 500C, bend upward, and extend radially outward horizontally. A leading end portion of each of the support arms 621 corresponds to the substrate support device 1B. As used herein, the term "leading end portion" of each support arm 621 is intended to include a portion of the each support arm 621 farthest from the center line 500C and a portion offset from and proximate to the farthest portion. That is, the rotatable support 620 may be regarded as including the substrate support device 1B.

The substrate support device 1B includes three pads 100. These pads 100 are similar to the pads 100 of the substrate support device 1 illustrated in FIG. 1 in that: the second fixed member 120 of each pad 100 is closer to the center line 500C and the first fixed member 110 is farther from the center line 500C; and the extension direction of the bridge 130 is along a radial direction of a circle centered around the center line 500C.

The lift support 630 is movable upward and downward along the center line 500C, and includes a support arm 631. The support arm 631 is movable upward and downward relative to the body 610. The support arm 631 includes three branches extending in horizontal directions while avoiding the rotatable support 620. Each of the three branches bends upward, and bends and extends toward the center line 500C. A leading end portion of the support arm 631 corresponds to the substrate support device 1C. As used herein, the term "leading end portion" of the support arm 631 is intended to include a portion of the support arm 631 extending toward the center line 500 and a portion offset from and proximate to the portion extending toward the center line 500. That is, the lift support 630 can be regarded as including the substrate support device 1C.

The substrate support device 1C includes three pads 100. These pads 100 are similar to the pads 100 of the substrate support device 1 illustrated in FIG. 1 in that: the second fixed member 120 of each pad 100 is closer to the center line 500C and the first fixed member 110 is farther from the center line 500C; and the extension direction of the bridge 130 is along a radial direction of a circle centered around the center line 500C.

The sensor 640 includes a detector 641. The detector 641 detects a mark, such as notch and oriental flat, provided on the outer circumference of the substrate 500 to indicate the substrate 500's crystal orientation. For example, the detector 641 emits light to the outer circumference of the substrate 500 to detect, in time order, how the emitted light is blocked by the substrate 500. For example, the detector 641 emits light to the upper surface or the lower surface of the substrate 500, and detects the emitted light from the opposite side of the surface.

An example of how the aligner device 600 moves will be described. First, the robot 10 illustrated in FIG. 8 places the substrate 500 on the lift support 630 of the aligner device 600. The substrate support devices 1C of the lift support 630 are disposed at positions higher than the positions of the substrate support devices 1B of the rotatable support 620.

Then, the lift support 630 supporting the substrate 500 is moved downward, and the substrate 500 is forwarded to the substrate support devices 1B of the rotatable support 620. Then, the rotatable support 620 rotates while supporting the substrate 500, and the sensor 640 checks the outer circumference of the substrate 500. The aligner device 600 or a controller for the aligner device 600 (for example, a robot controller to control motions of the robot 10) uses detection data obtained by the sensor 640 to calculate: the amount of deviation between ideal substrate center and actual substrate center (the center line 500C); and the angular position of the above-described mark (the angular position is equivalent to a rotational angle relative to a reference angle).

The rotatable support 620 stops rotating at the time when the angular position of the mark on the supported substrate 500 reaches a desired angular position. Then, the lift support 630 moves upward to receive the substrate 500 from the rotatable support 620. Then, the robot 10 receives the substrate 500 from the lift support 630 at a position determined with the amount of deviation detected by the sensor 640 taken into consideration.

If, for example, the support arms 621 of the rotatable support 620 interfere with the support arm 631 when the lift support 630 moves upward, it is possible to: rotate the rotatable support 620 by a predetermined angle; move the lift support 630 upward to receive the substrate 500 from the rotatable support 620; forward the substrate 500 back to the rotatable support 620; and detect the mark on the substrate 500.

If, for example, the support arms 621 of the rotatable support 620 overlap the mark on the substrate 500 and hinder detection of the mark, it is possible to: temporarily forward the substrate 500 from the rotatable support 620 to the lift support 630; rotate the rotatable support 620 by a predetermined angle; and forward the substrate 500 back to the rotatable support 620.

Thus, the aligner device 600 illustrated in FIG. 10 includes the rotatable support 620 and the lift support 630. That is, the rotation mechanism and the lift mechanism are independent of each other in the aligner device 600. This configuration is simpler than a single mechanism that doubles as the rotation mechanism and the lift mechanism. With a simplified configuration, the rotation accuracy and the lifting accuracy of the aligner device 600 increase.

It is to be noted that the lift support 630 may be omitted. In this case, before alignment of the substrate 500, it is possible, for example, to control the rotation of the rotatable support 620 so that the support arms 621 stop at positions where the support arms 621 are kept off the region where the approaching robot 10 occupies. Also, after alignment of the substrate 500, it is possible to: further rotate the rotatable support 620 by an angle to make the support arms 621 withdraw from the region where the robot 10 occupies; and notify the robot 10 of the angle.

As has been described hereinbefore, the substrate support device 1 according to the above-described embodiment includes the blade 200 and the pad 100, which is fixed to the blade 200 and supports the substrate 500. The pad 100 includes the first fixed member 110, the second fixed member 120, and the bridge 130. The first fixed member 110 is fixed to a radially outer portion of the blade 200. The radially outer portion is located beyond the outer circumference portion 510 of the substrate 500 when the substrate 500 is supported by the pad 100. The second fixed member 120 is fixed to a radially inner portion of the blade 200. The radially inner portion is closer to the center portion of the substrate 500 than the outer circumference portion 510 is to the center portion of the substrate 500 when the substrate 500 is supported by the pad 100. The bridge 130 connects the first fixed member 110 and the second fixed member 120 to each other, and supports the outer circumference portion 510. The bridge 130 is flexible such that the upper surface of the bridge 130 is inclined downward from the first fixed member 110 toward the second fixed member 120 when the substrate 500 is not supported by the pad 100.

Thus, the substrate support device 1 uses the bridge 130, which is made of a flexible material, to support the outer circumference portion 510 of the substrate 500 while taking such a posture that the bridge 130 is higher on the radially outside and lower on the radially inside. This eliminates or minimizes damage to the substrate 500 while eliminating or minimizing displacement and/or dropping of the substrate 500.

Also, the substrate conveyance robot 10 according to the above-described embodiment includes the hand 13. The hand 13 includes the substrate support devices 1. Also, the aligner device 600 according to the above-described embodiment includes the substrate support devices 1.

With the substrate support devices 1, the substrate conveyance robot 10 eliminates or minimizes damage to the substrate 500 while eliminating or minimizing displacement and/or dropping of the substrate 500. With the substrate support devices 1, the aligner device 600 eliminates or minimizes damage to the substrate 500 while eliminating or minimizing displacement and/or dropping of the substrate 500.

While in the above-described embodiment the pad 100 is fixed to the blade 200 via the hooks 112 and 122, the pad 100 may not necessarily be provided with the hooks 112 and 122; instead, the pad 100 may be bonded to the blade 200. Also, the hooks 112 and 122 may not necessarily be provided with the umbrella 112*b* and 122*b*; instead, it is possible to make the diameters of the shafts 112*a* and 122*a* larger than the diameters of the holes 211 and 212 of the blade 200, so that after the shafts 112*a* and 122*a* have been inserted in the holes 211 and 212, the shafts 112*a* and 122*a* are in close contact with the inner surfaces of the holes 211 and 212. Alternatively, it is possible to: make the diameters of the shafts 112*a* and 122*a* equal to or smaller than the diameters of the holes 211 and 212; and bond the shafts 112*a* and 122*a* to the inner surfaces of the holes 211 and 212.

Obviously, numerous modifications and variations of the present disclosure are possible in light of the above teachings. It is therefore to be understood that within the scope of the claims, the present disclosure may be practiced otherwise than as specifically described herein.

What is claimed as new and desired to be secured by Letters Patent of the United States is:

1. A substrate support device comprising:
    a blade; and
    at least one pad provided on the blade to support a substrate and comprising:
        a first fixed member provided at an outer portion of the blade, the outer portion being located outside an outer circumference portion of the substrate when the substrate is supported on the at least one pad;
        a second fixed member provided at an inner portion of the blade, the inner portion being under the substrate when the substrate is supported on the at least one pad; and
        a bridge being flexible and connecting the first fixed member and the second fixed member to support the outer circumference portion of the substrate, an upper surface of the bridge being inclined downward from the first fixed member toward the second fixed member when the substrate is not supported on the at least one pad.

2. The substrate support device according to claim 1, wherein the bridge has a lower surface that is apart from a surface of the blade when the substrate is not supported on the at least one pad, and
    wherein the bridge is bendable along a shape of an edge portion of the substrate due to a weight of the substrate when the substrate is supported on the at least one pad.

3. The substrate support device according to claim 2, wherein the substrate has a circular plate shape, and
    wherein the at least one pad comprises three pads provided on the blade, each of the three pads having the first fixed member and the second fixed member aligned in a radial direction of the substrate.

4. The substrate support device according to claim 3, wherein the blade comprises
    a first hole in which the first fixed member of the at least one pad is fittable, and
    a second hole in which the second fixed member of the at least one pad is fittable.

5. The substrate support device according to claim 4, wherein the blade has a second depression in which the second hole is provided, which has a bottom surface lower than an upper surface of the blade, and which extends toward the first hole and has a width larger than a width of the bridge.

6. The substrate support device according to claim 2, wherein the blade comprises
    a first hole in which the first fixed member of the at least one pad is fittable, and
    a second hole in which the second fixed member of the at least one pad is fittable.

7. The substrate support device according to claim 6, wherein the blade has a second depression in which the second hole is provided, which has a bottom surface lower than an upper surface of the blade, and which extends toward the first hole and has a width larger than a width of the bridge.

8. The substrate support device according to claim 6, wherein the first hole is disposed in a first depression of the blade, the first depression having a bottom surface lower than the upper surface of the blade and higher than the bottom surface of the second depression, the first depression extending toward the second hole and having a width larger than the width of the bridge.

9. The substrate support device according to claim 1, wherein the substrate has a circular plate shape, and
    wherein the at least one pad comprises three pads provided on the blade, each of the three pads having the first fixed member and the second fixed member aligned in a radial direction of the substrate.

10. The substrate support device according to claim 9, wherein the blade comprises
a first hole in which the first fixed member of the at least one pad is fittable, and
a second hole in which the second fixed member of the at least one pad is fittable.

11. The substrate support device according to claim 10, wherein the blade has a second depression in which the second hole is provided, which has a bottom surface lower than an upper surface of the blade, and which extends toward the first hole and has a width larger than a width of the bridge.

12. The substrate support device according to claim 1, wherein the blade comprises
a first hole in which the first fixed member of the at least one pad is fittable, and
a second hole in which the second fixed member of the at least one pad is fittable.

13. The substrate support device according to claim 12, wherein the first fixed member comprises a stopper having an upper end portion higher than an upper surface of the bridge.

14. The substrate support device according to claim 13, wherein when the substrate is supported by the bridge, the upper end portion of the stopper is higher than an upper surface of the substrate.

15. The substrate support device according to claim 12, wherein each of the first fixed member and the second fixed member comprises
a hook engageable with a lower surface of the blade through the first hole or the second hole of the blade, and
a support supporting the bridge at a position higher than an upper end portion of the first hole or the second hole.

16. The substrate support device according to claim 12, wherein an upper end portion of the second fixed member is approximately flush with an upper surface of the bridge, and
wherein the bridge is bendable due to a weight of the substrate to place the substrate on the upper end portion of the second fixed member, when the substrate is supported on the bridge.

17. The substrate support device according to claim 12, wherein the blade has a second depression in which the second hole is provided, which has a bottom surface lower than an upper surface of the blade, and which extends toward the first hole and has a width larger than a width of the bridge.

18. The substrate support device according to claim 17, wherein the first hole is disposed in a first depression of the blade, the first depression having a bottom surface lower than the upper surface of the blade and higher than the bottom surface of the second depression, the first depression extending toward the second hole and having a width larger than the width of the bridge.

19. A substrate conveyance robot comprising:
a hand comprising a substrate support device, the substrate support device comprising:
a blade; and
at least one pad provided on the blade to support a substrate and comprising:
a first fixed member provided at an outer portion of the blade, the outer portion being located outside an outer circumference portion of the substrate when the substrate is supported on the at least one pad;
a second fixed member provided at an inner portion of the blade, the inner portion being under the substrate when the substrate is supported on the at least one pad; and
a bridge being flexible and connecting the first fixed member and the second fixed member to support the outer circumference portion of the substrate, an upper surface of the bridge being inclined downward from the first fixed member toward the second fixed member when the substrate is not supported on the at least one pad.

20. An aligner device comprising:
a substrate support device comprising:
a blade; and
at least one pad provided on the blade to support a substrate and comprising:
a first fixed member provided at an outer portion of the blade, the outer portion being located outside an outer circumference portion of the substrate when the substrate is supported on the at least one pad;
a second fixed member provided at an inner portion of the blade, the inner portion being under the substrate when the substrate is supported on the at least one pad; and
a bridge being flexible and connecting the first fixed member and the second fixed member to support the outer circumference portion of the substrate, an upper surface of the bridge being inclined downward from the first fixed member toward the second fixed member when the substrate is not supported on the at least one pad.

* * * * *